(12) United States Patent
Kobayashi

(10) Patent No.: US 6,838,356 B2
(45) Date of Patent: Jan. 4, 2005

(54) METHOD OF FORMING A TRENCH ISOLATION

(75) Inventor: Kenya Kobayashi, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 230 days.

(21) Appl. No.: 09/956,142

(22) Filed: Sep. 20, 2001

(65) Prior Publication Data

US 2002/0034858 A1 Mar. 21, 2002

(30) Foreign Application Priority Data

Sep. 21, 2000 (JP) .......................................... 2000-286328

(51) Int. Cl.$^7$ ............................................... H01L 21/76
(52) U.S. Cl. ....................... 438/424; 438/428; 438/435; 438/436; 438/438
(58) Field of Search ............................... 438/424, 428, 438/435, 436, 438

(56) References Cited

U.S. PATENT DOCUMENTS

| | | | | | |
|---|---|---|---|---|---|
| 6,017,803 | A | * | 1/2000 | Wong | ........................ 438/430 |
| 6,057,209 | A | * | 5/2000 | Gardner et al. | ............. 438/427 |
| 6,096,622 | A | * | 8/2000 | Kim et al. | .................. 438/424 |
| 6,114,220 | A | * | 9/2000 | Tsai | ............................ 438/435 |
| 6,228,742 | B1 | * | 5/2001 | Yew et al. | ................... 438/400 |
| 6,235,608 | B1 | * | 5/2001 | Lin et al. | ..................... 438/424 |
| 6,265,281 | B1 | * | 7/2001 | Reinberg | .................... 438/400 |
| 6,337,255 | B1 | * | 1/2002 | Bradl et al. | ................. 438/424 |

FOREIGN PATENT DOCUMENTS

| | | |
|---|---|---|
| JP | A 8-23027 | 1/1996 |
| JP | A 11-297815 | 10/1999 |
| JP | A 2000-31266 | 1/2000 |

\* cited by examiner

*Primary Examiner*—David A. Zarneke
(74) *Attorney, Agent, or Firm*—Young & Thompson

(57) ABSTRACT

The present invention provides a method of forming a trench isolation in a substrate, which comprises the steps of: forming a trench groove in a substrate; forming a first electrically insulating layer which fills the trench groove and extends over an upper surface of the substrate, wherein the first electrically insulating layer has a first surface migration, and an upper surface of the first electrically insulating layer has a first hollow positioned over the trench groove; and forming a second electrically insulating layer over the first electrically insulating layer, wherein the second electrically insulating layer fills the first hollow, and an upper surface of the second electrically insulating layer has a second hollow positioned over the trench groove, and the second electrically insulating layer has a second surface migration smaller than the first surface migration.

18 Claims, 25 Drawing Sheets

METHOD OF FORMING A TRENCH ISOLATION

BACKGROUND OF THE INVENTION

1. Field of the Invention

The present invention relates to a method of forming a semiconductor integrated circuit, and more particularly to a trench isolation in a semiconductor integrated circuit.

2. Description of the Related Art

Isolations for electrically isolating semiconductor devices are important for the semiconductor integrated circuit with a high withstand voltage. It was known that one or more trench isolations are formed in a silicon-on-insulator substrate. In the semiconductor integrated circuit with the high withstand voltage, a depth of the semiconductor devices may reach a few micrometers, for which reason it is necessary that the trench depth is ranged from a few micrometers to 10 micrometers.

Japanese laid-open patent publication No. 8-23027 discloses that TEOS (Tetra Etyl Ortho Silicate)-$SiO_2$ is filled within a trench groove in the silicon-on-insulator substrate. FIGS. 1A through 1D are fragmentary cross sectional elevation views illustrative of trench isolations in silicon-on-insulator substrates in sequential steps involved in a first conventional method.

With reference to FIG. 1A, a silicon-on-insulator substrate 20 is prepared, wherein the silicon-on-insulator substrate 20 comprises first and second silicon substrates 11 and 12 and a buried insulating layer 13 sandwiched between the first and second silicon substrates 11 and 12. A surface of the first silicon substrate 11 is subjected to a thermal oxidation to form an oxide film 14.

With reference to FIG. 1B, a photo-resist film is applied on the oxide film 14. The photo-resist film is patterned by a photo-lithography technique to form a photo-resist mask on the oxide film 14. The photo-resist mask is used as an etching mask for carrying out an anisotropic etching for selectively etching the oxide film 14, so that a part of the surface of the first silicon substrate 11 is exposed. A reactive ion etching process is then carried out for selectively etching the first silicon substrate 11 to form a trench groove 15 in the first silicon substrate 11, wherein the trench groove 15 reaches the buried insulating layer 13.

With reference to FIG. 1C, a chemical vapor deposition process is carried out using a TEOS gas to deposit a TEOS-$SiO_2$ film 16 both within the trench groove 15 and over the oxide film 14, whereby the trench groove 15 is completely filled with the TEOS-$SiO_2$ film 16.

With reference to FIG. 1D, the TEOS-$SiO_2$ film 16 is then subjected to an etch-back so that the thickness of the TEOS-$SiO_2$ film 16 over the oxide film 14 becomes a predetermined thickness "d". Optionally, the etch-back may be made until the surface of the oxide film 14 is exposed and the TEOS-$SiO_2$ film 16 remains only within the trench groove 15. Alternatively, the etch-back may be made until the surface of the first silicon substrate 11 is exposed and the TEOS-$SiO_2$ film 16 remains only within the trench groove 15.

As described above, the TEOS-$SiO_2$ film 16 is deposited by the chemical vapor deposition process using the TEOS gas. This TEOS-$SiO_2$ film 16 has a large surface migration and a good surface coverage. In the chemical vapor deposition process, the TEOS-$SiO_2$ film 16 is deposited with substantially keeping a thickness uniformity on side walls and a bottom of the trench groove 15 and over the oxide film 14. Namely, in the chemical vapor deposition process, the thickness of the TEOS-$SiO_2$ film 16 is increased with keeping the thickness uniformity on side walls and a bottom of the trench groove 15 and over the oxide film 14. For this reason, an upper surface of the TEOS-$SiO_2$ film 16 as deposited has a generally V-shaped hollow portion which is positioned over the trench groove 15. As shown in FIG. 1D, the generally V-shaped hollow portion remains after the etch back process. Therefore, it is difficult to obtain a planarized top surface of the TEOS-$SiO_2$ film 16.

In a later process, a metal interconnection layer is once entirely formed over the entire surface of the TEOS-$SiO_2$ film 16, and then the metal interconnection layer is patterned or selectively removed to form an interconnection extending over the TEOS-$SiO_2$ film 16. It is possible that the metal interconnection layer resides within the TEOS-$SiO_2$ film 16. This residual metal in the generally V-shaped hollow portion may cause a short circuit between interconnections. If a tapered angle of the generally V-shaped hollow portion is larger than 20 degrees, it is highly possible that the metal interconnection layer resides within the TEOS-$SiO_2$ film 16.

Japanese laid-open patent publication No. 8-23027 discloses that TEOS (Tetra Etyl Ortho Silicate)-$SiO_2$ is filled within a trench groove in the silicon-on-insulator substrate. FIGS. 2A through 2D are fragmentary cross sectional elevation views illustrative of trench isolations in silicon-on-insulator substrates in sequential steps involved in a second conventional method.

With reference to FIG. 2A, a silicon-on-insulator substrate 20 is prepared, wherein the silicon-on-insulator substrate 20 comprises first and second silicon substrates 11 and 12 and a buried insulating layer 13 sandwiched between the first and second silicon substrates 11 and 12. A surface of the first silicon substrate 11 is subjected to a thermal oxidation to form an oxide film 14.

With reference to FIG. 2B, a photo-resist film is applied on the oxide film 14. The photo-resist film is patterned by a photo-lithography technique to form a photo-resist mask on the oxide film 14. The photo-resist mask is used as an etching mask for carrying out an anisotropic etching for selectively etching the oxide film 14, so that a part of the surface of the first silicon substrate 11 is exposed. A reactive ion etching process is then carried out for selectively etching the first silicon substrate 11 to form a trench groove 15 in the first silicon substrate 11, wherein the trench groove 15 reaches the buried insulating layer 13.

With reference to FIG. 2C, a chemical vapor deposition process is carried out using a TEOS gas to deposit a TEOS-BPSG film 17 both within the trench groove 15 and over the oxide film 14, whereby the trench groove 15 is completely filled with the TEOS-BPSG film 17. The TEOS-BPSG film 17 is deposited by the chemical vapor deposition process using the TEOS gas. An upper surface of the TEOS-BPSG film 17 as deposited has a generally V-shaped hollow portion which is positioned over the trench groove 15. Further, it is possible that a void 19 is formed in the TEOS-BPSG film 17 in the trench groove 15.

With reference to FIG. 2D, a heat treatment is carried out at about 900° C. to cause a re-flow of the TEOS-BPSG film 17 for the purpose of planarizing the generally V-shaped hollow portion on the surface of the TEOS-BPSG film 17. The re-flow of the TEOS-BPSG film 17 also causes a size reduction of the void 19, even the void 19 does not disappear.

With reference to FIG. 2E, the TEOS-BPSG film 17 is then subjected to an etch-back so that the thickness of the TEOS-BPSG film 17 over the oxide film 14 becomes a predetermined thickness "Z". Optionally, the etch-back may be made until the surface of the oxide film 14 is exposed and the TEOS-BPSG film 17 remains only within the trench groove 15. Alternatively, the etch-back may be made until the surface of the first silicon substrate 11 is exposed and the TEOS-BPSG film 17 remains only within the trench groove 15.

As described above, the TEOS-BPSG film 17 is deposited by the chemical vapor deposition process using the TEOS gas. This TEOS-BPSG film 17 has a small surface migration and a low surface coverage. For this reason, in the chemical vapor deposition process, the TEOS-BPSG film 17 is deposited without keeping a thickness uniformity on side walls and a bottom of the trench groove 15 and over the oxide film 14. Namely, in the chemical vapor deposition process, the thickness of the TEOS-BPSG film 17 adjacent to an opening edge of the trench groove 15 is larger than the other portions thereof. This may cause the void 19 in the TEOS-BPSG film 17 in the trench groove 15. The void 19 deteriorates the trench isolation. Further, a residual gas in the void 19 may be expanded in the later heat treatment, whereby it is possible that the trench isolation is broken.

In the above circumstances, the development of a novel method of forming a trench isolation in a substrate free from the above problems is desirable.

SUMMARY OF THE INVENTION

Accordingly, it is an object of the present invention to provide a novel method of forming a trench isolation in a substrate free from the above problems.

It is a further object of the present invention to provide a novel method of forming a void-free trench isolation in a substrate.

It is a still further object of the present invention to provide a novel method of forming a trench isolation with a palatalized upper surface.

It is yet a further object of the present invention to provide a novel method of forming a trench isolation in a silicon-on-insulator substrate for isolating semiconductor devices with high withstand voltages.

It is another object of the present invention to provide a novel trench isolation in a substrate free from the above problems.

It is a further object of the present invention to provide a novel void-free trench isolation in a substrate.

It is a still further object of the present invention to provide a novel trench isolation with a palatalized upper surface.

It is yet a further object of the present invention to provide a novel trench isolation in a silicon-on-insulator substrate for isolating semiconductor devices with high withstand voltages.

The present invention provides a method of forming a trench isolation in a substrate, which comprises the steps of: forming a trench groove in a substrate; forming a first electrically insulating layer which fills the trench groove and extends over an upper surface of the substrate, wherein the first electrically insulating layer has a first surface migration, and an upper surface of the first electrically insulating layer has a first hollow positioned over the trench groove; and forming a second electrically insulating layer over the first electrically insulating layer, wherein the second electrically insulating layer fills the first hollow, and an upper surface of the second electrically insulating layer has a second hollow positioned over the trench groove, and the second electrically insulating layer has a second surface migration smaller than the first surface migration.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION OF THE PREFERRED EMBODIMENTS

Figure 1A:
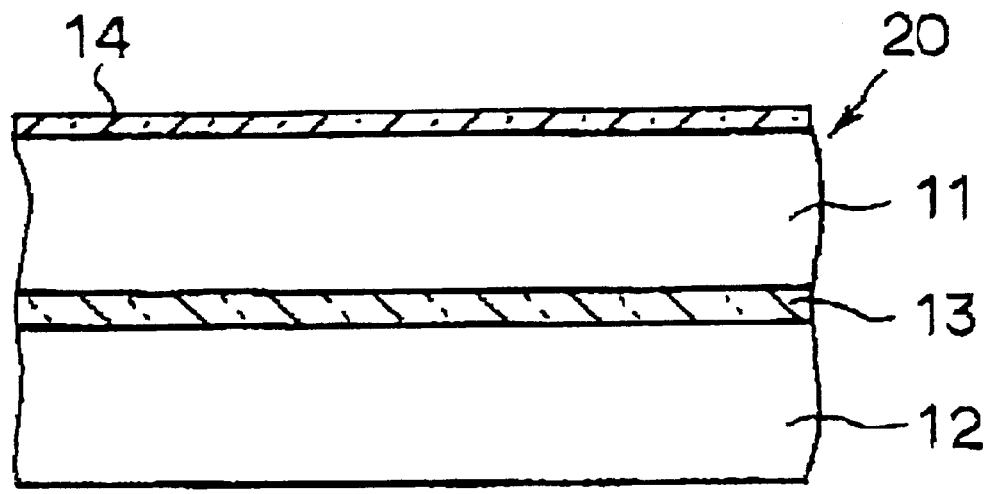
FIGS. 1A through 1D are fragmentary cross sectional elevation views illustrative of trench isolations in silicon-on-insulator substrates in sequential steps involved in a first conventional method.
Figure 1B:
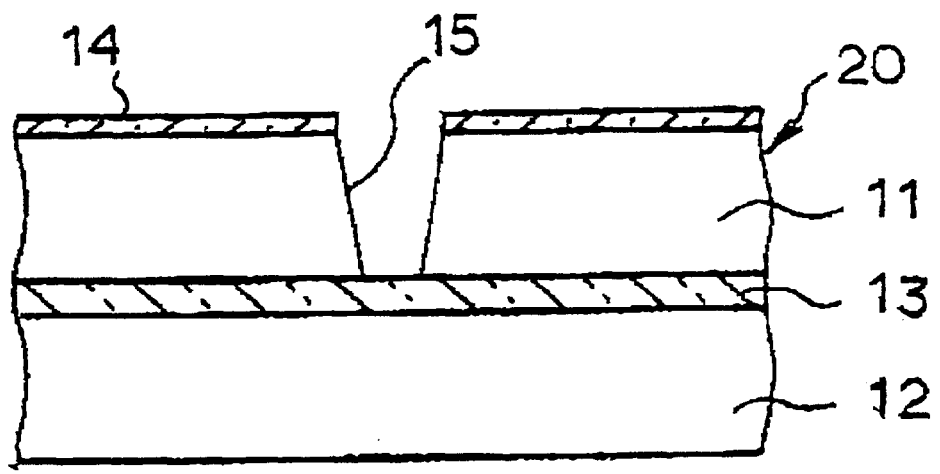
Figure 1C:
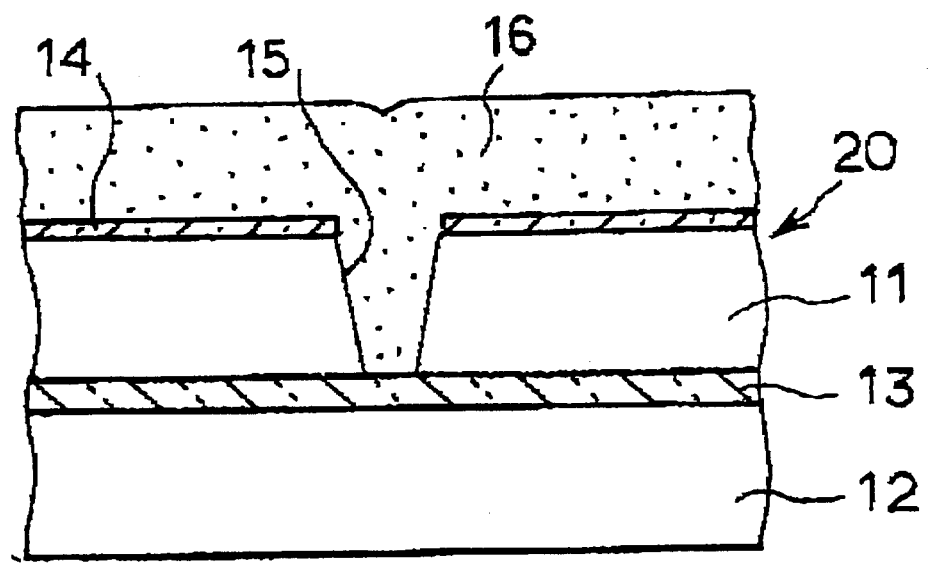
Figure 1D:
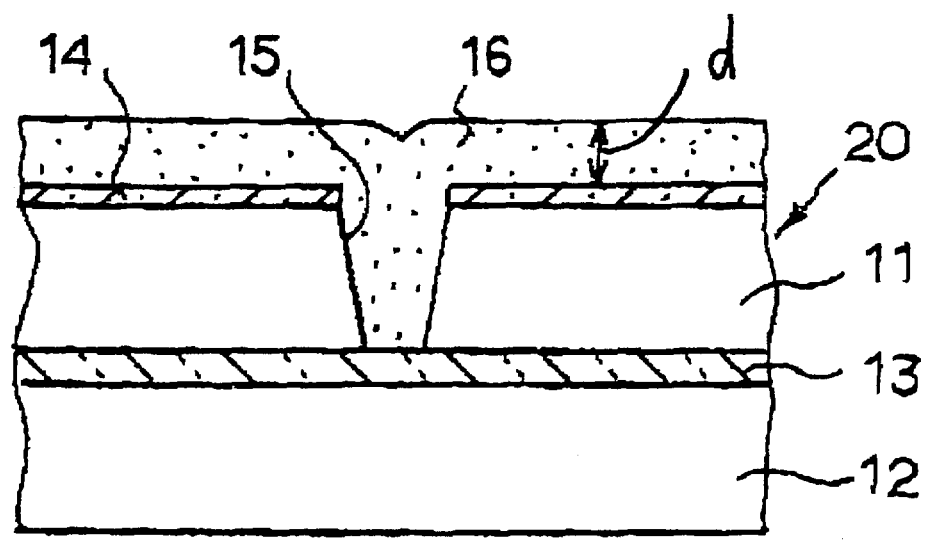
Figure 2A:
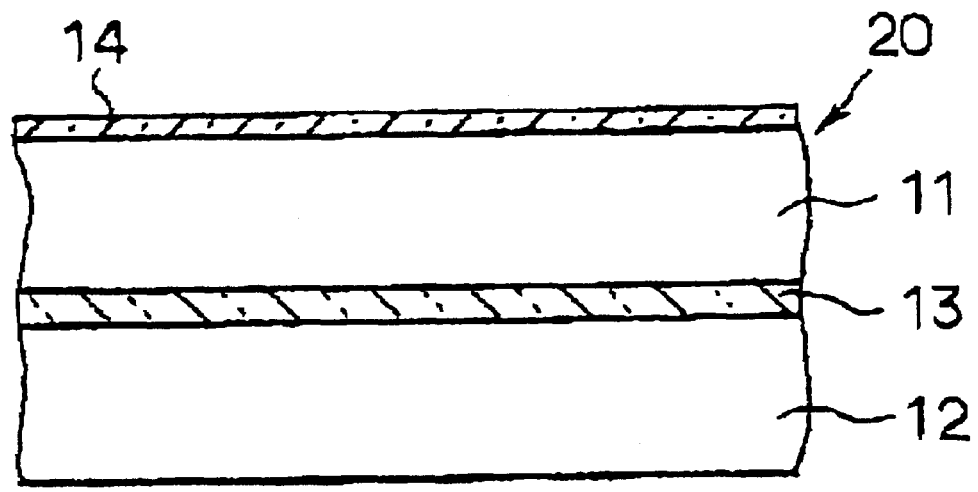
FIGS. 2A through 2E are fragmentary cross sectional elevation views illustrative of trench isolations in silicon-on-insulator substrates in sequential steps involved in a second conventional method.
Figure 2B:
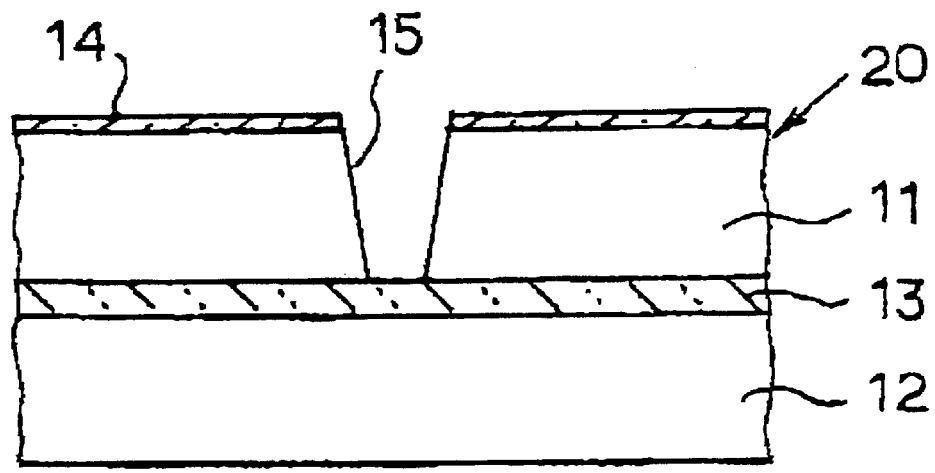
Figure 2C:
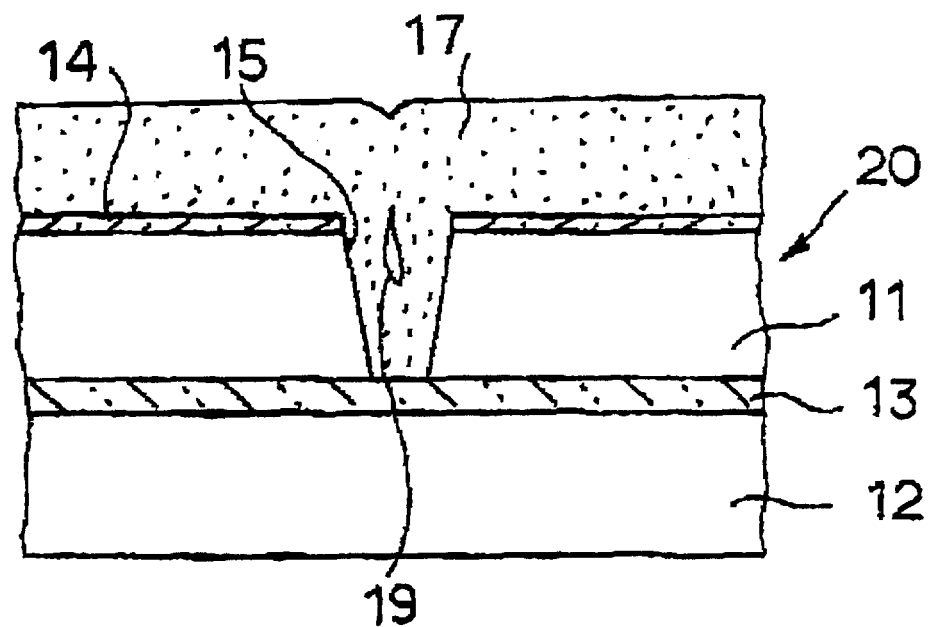
Figure 2D:
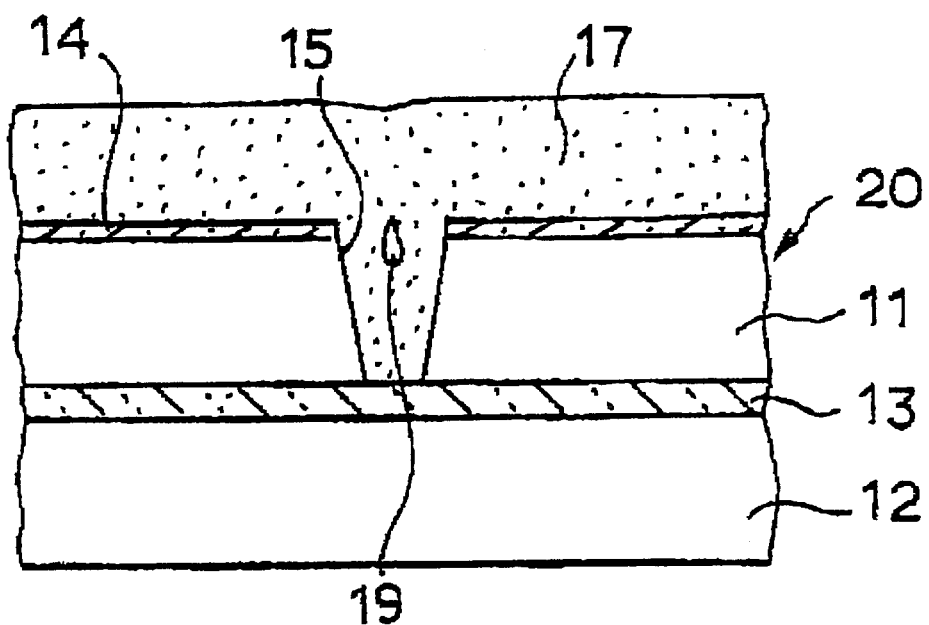
Figure 2E:
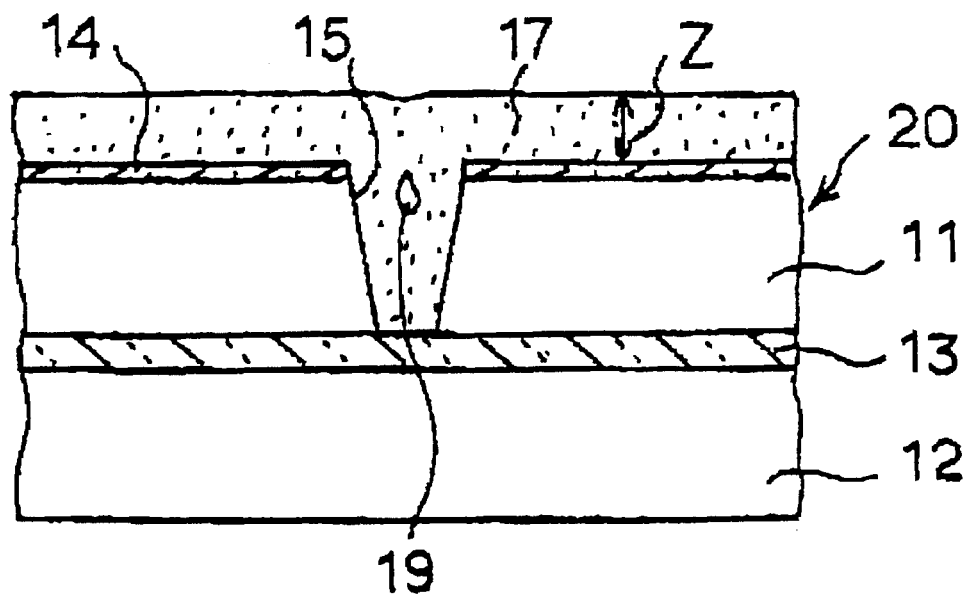

A first aspect of the present invention is a method of forming a trench isolation in a substrate. The method comprises the steps of: forming a trench groove in a substrate; forming a first electrically insulating layer which fills the trench groove and extends over an upper surface of the substrate, wherein the first electrically insulating layer has a first surface migration, and an upper surface of the first electrically insulating layer has a first hollow positioned over the trench groove; and forming a second electrically insulating layer over the first electrically insulating layer, wherein the second electrically insulating layer fills the first hollow, and an upper surface of the second electrically insulating layer has a second hollow positioned over the trench groove, and the second electrically insulating layer has a second surface migration smaller than the first surface migration.

It is preferable to further comprise the step of: carrying out a heat treatment to cause a surface re-flow of the second electrically insulating layer, whereby the second hollow is reduced in size.

It is further preferable to moreover comprise the step of:
carrying out an etch back to the first and second electrically insulating layers after the heat treatment, whereby the second hollow is reduced in size.

It is further preferable that a taper angle of the second hollow after the etch back is not more than 20 degrees.

It is also preferable that a thickness of the first electrically insulating layer over the upper surface of the substrate is almost equal to a distance between the first hollow and an opening edge of the trench groove.

It is also preferable that a thickness of the first electrically insulating layer over the upper surface of the substrate is larger than a half of an opening diameter of the trench groove.

It is preferable to further comprise the step of: carrying out an etch-back to the first electrically insulating layer only, whereby the first hollow is reduced in size, before the second electrically insulating layer is then formed over the etch-backed surface of the first electrically insulating layer.

It is preferable to further more comprise the step of: carrying out another etch-back to the second electrically insulating layer only separately from the etch-back to the first electrically insulating layer, whereby the second hollow is reduced in size.

It is preferable to moreover comprise the step of: carrying out a heat treatment to cause a surface re-flow of the second electrically insulating layer, whereby the second hollow is reduced in size, before the another etch-back to the second electrically insulating layer.

It is also preferable that the first electrically insulating layer comprises a non-doped silicate glass film.

It is further preferable that the non-doped silicate glass film is formed by a low pressure chemical vapor deposition using a tetra ethyl ortho silicate gas.

It is also preferable that the second electrically insulating layer comprises a boro-phospho silicate glass film.

It is further preferable that the boro-phospho silicate glass film is formed by a low pressure chemical vapor deposition using a tetra ethyl ortho silicate gas.

It is also preferable that the boro-phospho silicate glass film is formed by a normal pressure chemical vapor deposition using a tetra ethyl ortho silicate gas.

It is also preferable that the boro-phospho silicate glass film is formed by a normal pressure chemical vapor deposition using silane ($SiH_4$), phosphine ($PH_3$), diborane ($B_2H_6$), and oxygen ($O_2$).

It is also preferable that the first electrically insulating layer has a first re-flowablity, and the second electrically insulating layer has a second re-flowablity larger than the first re-flowablity.

It is also preferable that the first electrically insulating layer has a first surface coverage, and the second electrically insulating layer has a second surface coverage smaller than the first surface coverage.

A second aspect of the present invention is a method of forming a trench isolation in a substrate. The method comprises the steps of:

forming a trench groove in a substrate; forming a first electrically insulating layer which fills the trench groove and extends over an upper surface of the substrate, wherein the first electrically insulating layer has a first surface coverage, and an upper surface of the first electrically insulating layer has a first hollow positioned over the trench groove; and forming a second electrically insulating layer over the first electrically insulating layer, wherein the second electrically insulating layer fills the first hollow, and an upper surface of the second electrically insulating layer has a second hollow positioned over the trench groove, and the second electrically insulating layer has a second surface coverage smaller than the first surface coverage.

It is preferable to further comprise the step of: carrying out a heat treatment to cause a surface re-flow of the second electrically insulating layer, whereby the second hollow is reduced in size.

It is preferable to further comprise the step of: carrying out an etch back to the first and second electrically insulating layers after the heat treatment, whereby the second hollow is reduced in size.

It is further preferable that a taper angle of the second hollow after the etch back is not more than 20 degrees.

It is also preferable that a thickness of the first electrically insulating layer over the upper surface of the substrate is almost equal to a distance between the first hollow and an opening edge of the trench groove.

It is also preferable that a thickness of the first electrically insulating layer over the upper surface of the substrate is larger than a half of an opening diameter of the trench groove.

It is preferable to further comprise the step of: carrying out an etch-back to the first electrically insulating layer only, whereby the first hollow is reduced in size, before the second electrically insulating layer is then formed over the etch-backed surface of the first electrically insulating layer.

It is preferable to furthermore comprise the step of: carrying out another etch-back to the second electrically insulating layer only separately from the etch-back to the first electrically insulating layer, whereby the second hollow is reduced in size.

It is preferable to moreover comprise the step of: carrying out a heat treatment to cause a surface re-flow of the second electrically insulating layer, whereby the second hollow is reduced in size, before the another etch-back to the second electrically insulating layer.

It is preferable that the first electrically insulating layer comprises a non-doped silicate glass film.

It is further preferable that the non-doped silicate glass film is formed by a low pressure chemical vapor deposition using a tetra ethyl ortho silicate gas.

It is also preferable that the second electrically insulating layer comprises a boro-phospho silicate glass film.

It is further preferable that the boro-phospho silicate glass film is formed by a low pressure chemical vapor deposition using a tetra ethyl ortho silicate gas.

It is also preferable that the boro-phospho silicate glass film is formed by a normal pressure chemical vapor deposition using a tetra ethyl ortho silicate gas.

It is also preferable that the boro-phospho silicate glass film is formed by a normal pressure chemical vapor deposition using silane ($SiH_4$), phosphine ($PH_3$), diborane ($B_2H_6$), and oxygen ($O_2$).

It is also preferable that the first electrically insulating layer has a first re-flowablity, and the second electrically insulating layer has a second re-flowablity larger than the first re-flowablity.

It is also preferable that the first electrically insulating layer has a first surface migration, and the second electrically insulating layer has a second surface migration smaller than the first surface migration.

First Embodiment:

A first embodiment according to the present invention will be described in detail with reference to the drawings. FIGS. 3A through 3H are fragmentary cross sectional elevation views illustrative of trench isolations in silicon-on-insulator substrates in sequential steps involved in a first novel method in a first embodiment in accordance with the present invention.

Figure 3A:
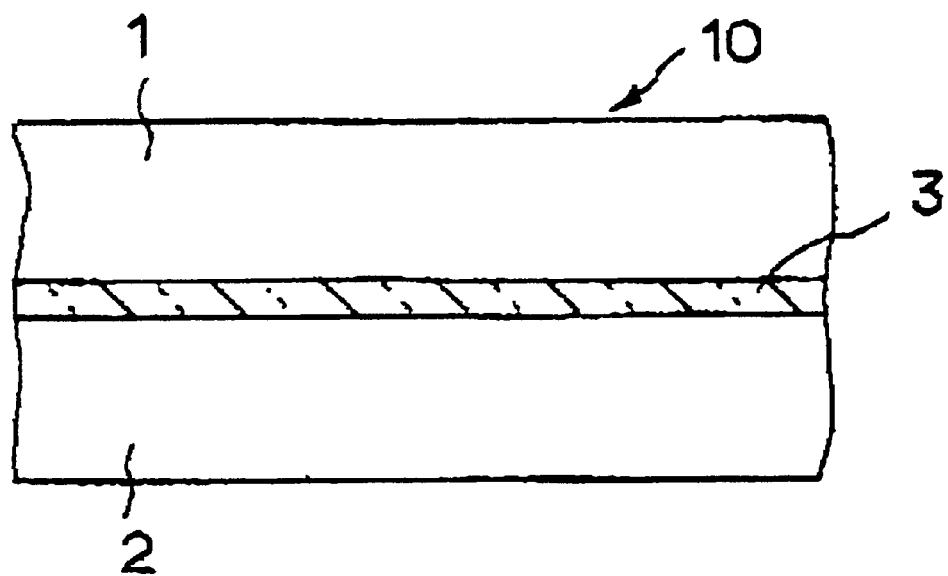
FIGS. 3A through 3H are fragmentary cross sectional elevation views illustrative of trench isolations in silicon-on-insulator substrates in sequential steps involved in a first novel method in a first embodiment in accordance with the present invention.

With reference to FIG. 3A, a silicon-on-insulator substrate 10 is prepared, wherein the silicon-on-insulator substrate 10 comprises first and second silicon substrates 1 and 2 and a buried insulating layer 3 sandwiched between the first and second silicon substrates 1 and 2. The silicon-on-insulator substrate 10 may be formed as follows.

A surface of the first silicon substrate 1 is subjected to a thermal oxidation to form a buried insulating layer 3 on the surface of the first silicon substrate 1. The second silicon substrate 2 is combined with the buried insulating layer 3 on the first silicon substrate 1. A surface of the first silicon substrate 1 is then polished to form a planarized main face of the silicon-on-insulator substrate 10.

A thickness, a conductivity type and a resistivity of the first silicon substrate 1 may be decided depending on semiconductor devices with high withstand voltages, for examples, MOS transistors and bipolar transistors. For example, the thickness may be 5 micrometers, the conductivity type may be p-type, and the resistivity may be ranged from 10–20 ohms cm.

Since the first silicon substrate 1 is relatively thin, the second silicon substrate 2 serves as a supporting substrate. The thickness of the second silicon substrate 2 is preferably thicker than the first silicon substrate 1. The thickness of the second silicon substrate 2 may be ranged from 600–700 micrometers. A conductivity type and a resistivity of the second silicon substrate 2 may be decided independent from semiconductor devices with high withstand voltages, for examples, MOS transistors and bipolar transistors. For example, the conductivity type may be p-type, and the resistivity may be ranged from 1–50 ohms cm.

The buried insulating layer 3 is provided not only for allowing isolation but also for allowing high withstand voltage. The increase in thickness of the buried insulating layer 3 increases the withstand voltage for high voltage semiconductor devices. The buried insulating layer 3 may generally comprise an $SiO_2$ layer formed by a thermal oxidation. For forming an MOSFET with a withstand voltage of 100V, a preferable thickness of the buried insulating layer 3 may be about 1 micrometer. For forming an MOSFET with a withstand voltage of 200V, a preferable thickness of the buried insulating layer 3 may be about 2 micrometers.

Figure 3B:
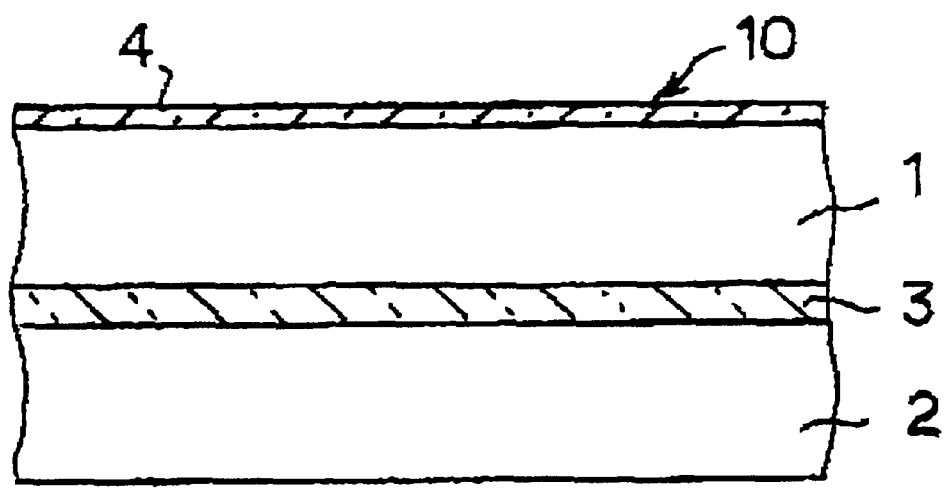

With reference to FIG. 3B, an oxide film 4 is formed on the planarized surface of the first silicon substrate 1 by either a thermal oxidation or a chemical vapor deposition. A thickness of the oxide film 4 may be about 5 micrometers.

Figure 3C:
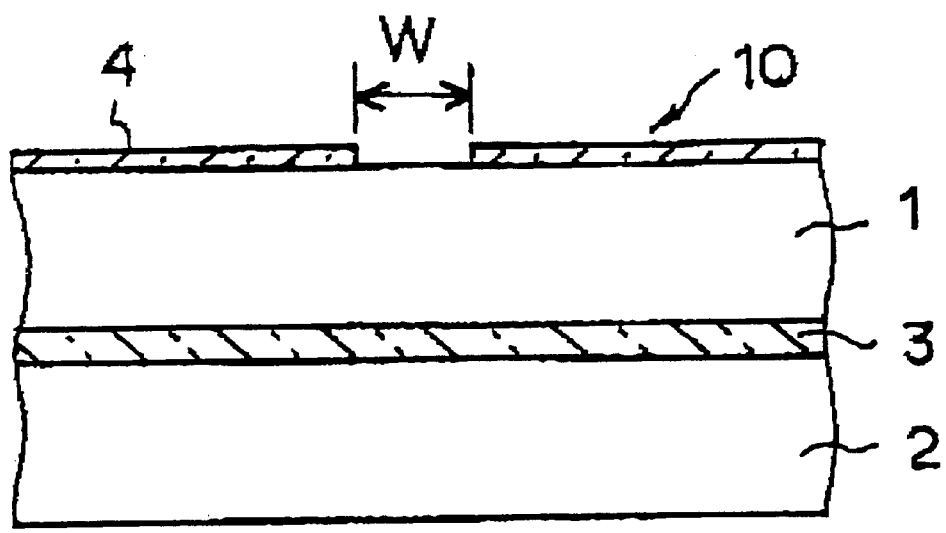

With reference to FIG. 3C, a photo-resist film is applied on the oxide film 4. The photo-resist film is patterned by a photo-lithography technique to form a photo-resist mask on the oxide film 4. The photo-resist mask is used as an etching mask for carrying out an anisotropic etching for selectively etching the oxide film 4 at a predetermined pattern width "W", so that a part of the surface of the first silicon substrate 1 is exposed.

Figure 3D:
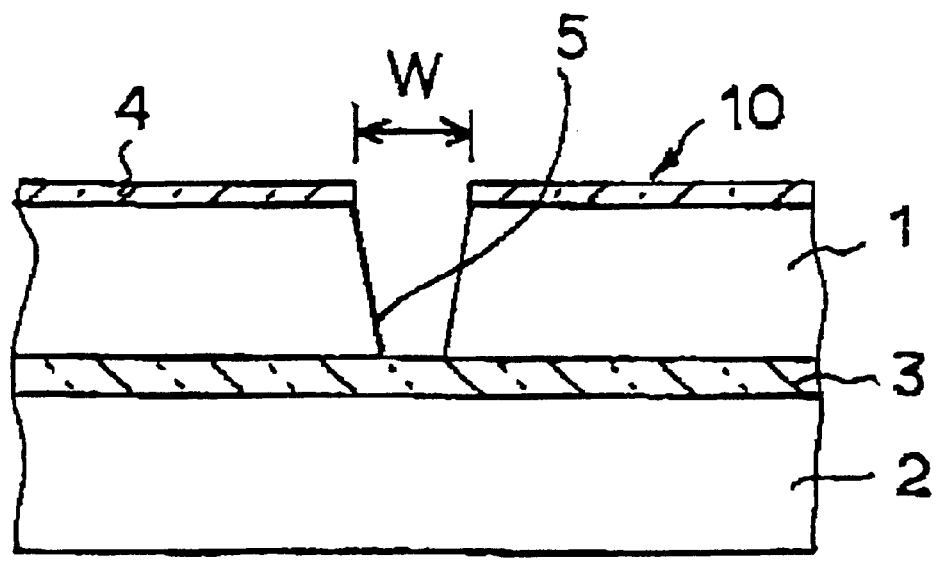

With reference to FIG. 3D, a reactive ion etching process is then carried out using the oxide film 4 as a mask for selectively etching the first silicon substrate 1 to form a trench groove 5 in the first silicon substrate 1, wherein the trench groove 5 reaches the buried insulating layer 3. An incline gradient of the trench groove 5 may vary depending on combinations of used etching gases and flow rates. A generally available incline gradient of the trench groove 5 may be ranged from about 80 degrees to about 90 degrees. The trench groove 5 has an opening width "W" defined by the opening width "W" of the oxide film 4. A bottom width of the trench groove 5 depends on the incline gradient. For forming an MOSFET with a withstand voltage of 100V, a preferable opening width "W" of the oxide film 4 may be ranged from about 1 micrometer to about 2 micrometers.

Figure 3E:
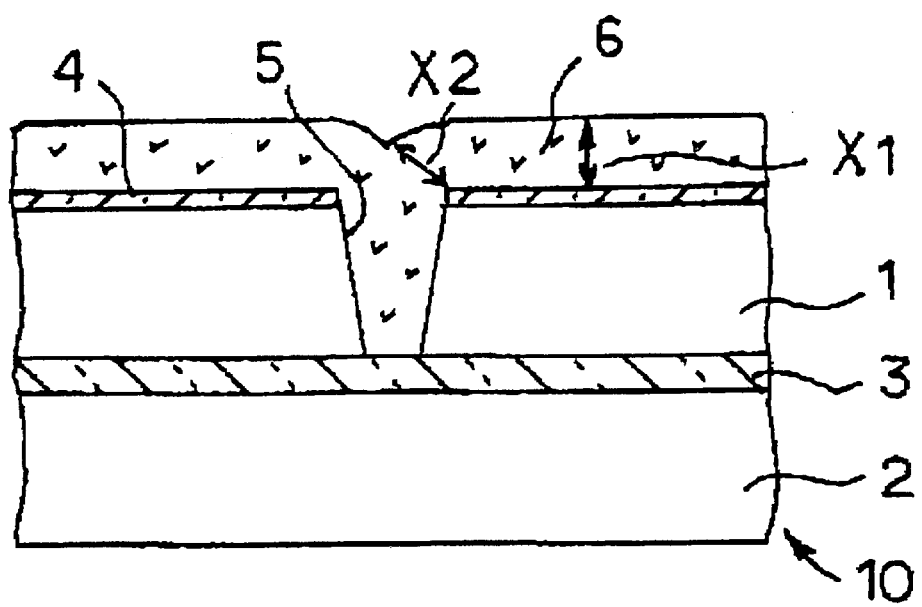

With reference to FIG. 3E, a low pressure chemical vapor deposition process is carried out using a TEOS (Tetra Etyl Ortho Silicate) gas to deposit a TEOS-NSG (Non-doped Silicate Glass) film 6 both within the trench groove 5 and over the oxide film 4, whereby the trench groove 5 is completely filled with the TEOS-NSG film 6. NSG (Non-doped Silicate Glass) is an undoped oxide material which is similar to TEOS-$SiO_2$. The low pressure chemical vapor deposition process is suitable for a low deposition rate of not more than 30 nm/min for completely filling the TEOS-NSG film 6 within the trench groove 5 having a width of 1–2 micrometers and a depth of 5 micrometers.

This TEOS-NSG film 6 has a large surface migration and a good surface coverage. In the low pressure chemical vapor deposition process, the TEOS-NSG film 6 is deposited with substantially keeping a thickness uniformity on side walls and a bottom of the trench groove 5 and over the oxide film 4. Namely, in the low pressure chemical vapor deposition process, the thickness of the TEOS-NSG film 6 is increased with keeping the thickness uniformity on side walls and a bottom of the trench groove 5 and over the oxide film 4. For this reason, an upper surface of the TEOS-NSG film 6 as deposited has a generally V-shaped hollow portion which is positioned over the trench groove 5.

A thickness "X1" of the TEOS-NSG film 6 over the oxide film 4 is almost equal to a distance "X2" between the opening edge of the oxide film 4 to the generally V-shaped hollow portion because of the large surface migration of the TEOS-NSG film 6 and the slow deposition by the low pressure chemical vapor deposition. It is preferable that the thickness "X1" of the TEOS-NSG film 6 over the oxide film 4 is not less than a half of the opening width "W" of the oxide film 4. A heat treatment is then carried out at 900° C. for 10 minutes in a nitrogen atmosphere for stabilizing the film quality of the TEOS-NSG film 6.

Figure 3F:
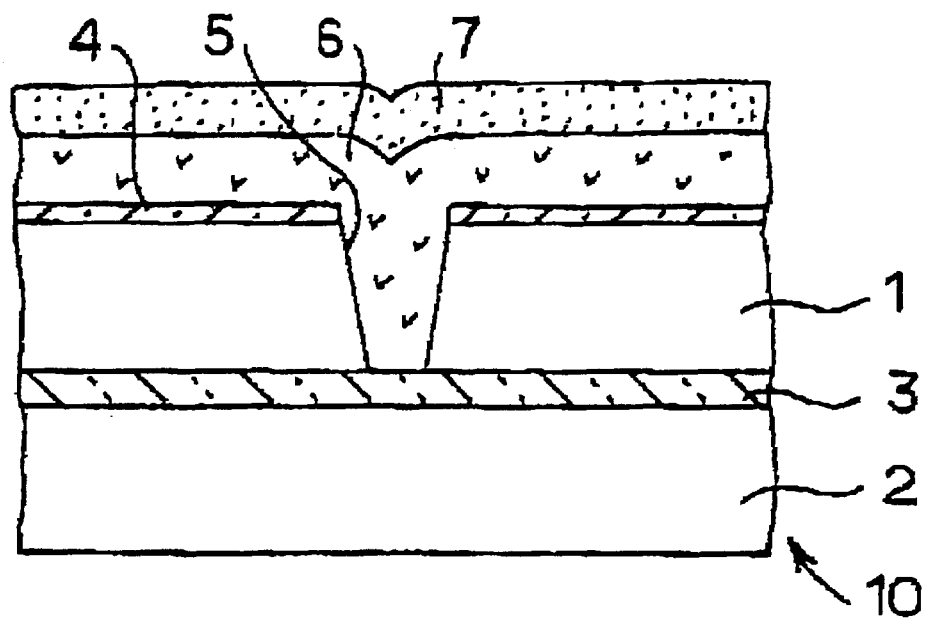

With reference to FIG. 3F, another low pressure chemical vapor deposition process is carried out using a TEOS (Tetra Etyl Ortho Silicate) gas to deposit a TEOS-BPSG (boro-phospho-silicate glass) film 7 over the TEOS-NSG film 6 for completely filling the generally V-shaped hollow portion of the TEOS-NSG film 6 with the TEOS-BPSG film 7. Another generally V-shaped hollow portion is formed on the surface of the TEOS-BPSG film 7.

Alternatively, a normal pressure chemical vapor deposition process with a higher deposition rate than the low pressure chemical vapor deposition process may be available by use of the TEOS gas, provided that the generally V-shaped hollow portion of the TEOS-NSG film 6 is completely filled with the TEOS-BPSG film 7. For using the TEOS gas, trimethylphosphate ($P(OCH_3)_3$), triethylborate ($B(OC_2H_5)_3$), and either oxygen ($O_2$) or ozone ($O_3$) are used as additives. Another generally V-shaped hollow portion is formed on the surface of the TEOS-BPSG film 7.

Further alternatively, a normal pressure chemical vapor deposition process with a higher deposition rate than the low pressure chemical vapor deposition process may also be available without using the TEOS gas to deposit a BPSG film 7, provided that the generally V-shaped hollow portion of the TEOS-NSG film 6 is completely filled with the BPSG film 7. Instead of the TEOS gas, silane ($SiH_4$), phosphine ($PH_3$), diborane ($B_2H_6$), and oxygen ($O_2$) are used. Another generally V-shaped hollow portion is formed on the surface of the BPSG film 7.

Figure 3G:
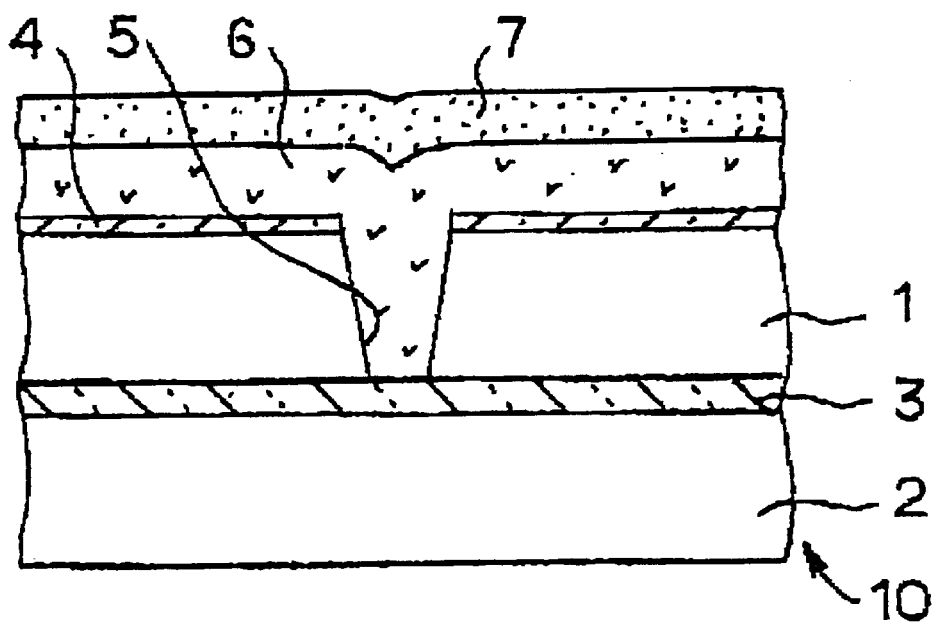

With reference to FIG. 3G, a heat treatment is carried out at about 800–900° C. for about 10 minutes in a nitrogen atmosphere to cause a surface re-flow of the BPSG film 7 whereby the generally V-shaped hollow portion on the surface of the BPSG film 7 is reduced in size. Namely, a slight and smooth hollow resides on the surface of the BPSG film 7.

Figure 3H:
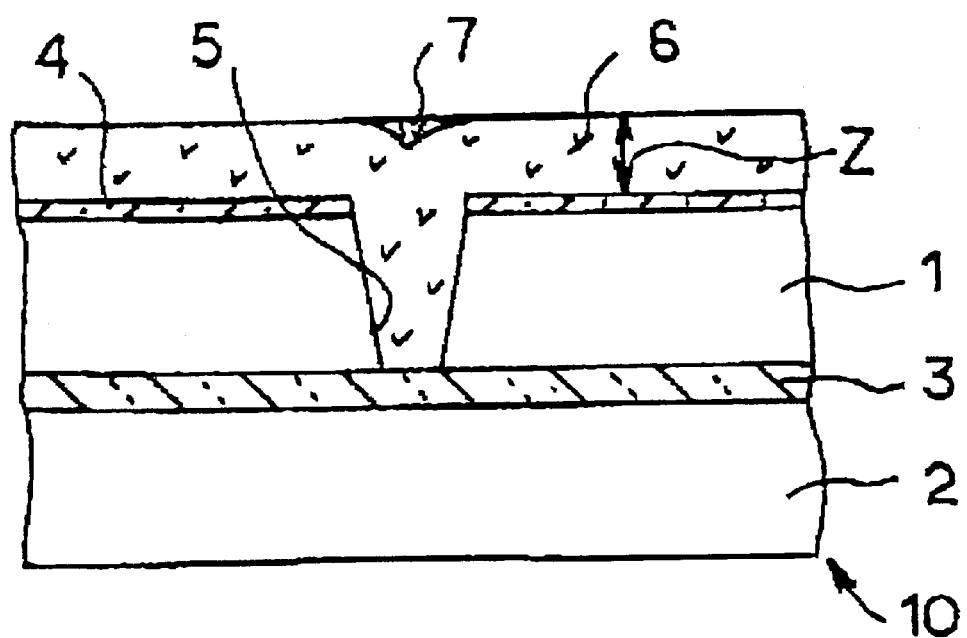

With reference to FIG. 3H, the BPSG film 7 and the TEOS-NSG film 6 are then subjected to an etch-back so that the thickness of the TEOS-NSG film 6 over the oxide film 4 becomes a predetermined value "Z", wherein the BPSG film 7 remains only within the generally V-shaped hollow portion of the TEOS-NSG film 6. Optionally, the etch-back may be made until the surface of the oxide film 4 is exposed and the TEOS-NSG film 6 remains only within the trench groove 5. Alternatively, the etch-back may be made until the surface of the first silicon substrate 1 is exposed and the TEOS-NSG film 6 remains only within the trench groove 5.

As described above, the trench groove 5 is completely filled with the NSG film 6. This NSG film 6 has a large surface migration and a good surface coverage, for which reason no void is formed in the NSG film 6. In the chemical vapor deposition process, however, the NSG film 6 is deposited with substantially keeping a thickness uniformity on side walls and a bottom of the trench groove 5 and over the oxide film 4. Namely, in the chemical vapor deposition process, the thickness of the NSG film 6 is increased with keeping the thickness uniformity on side walls and a bottom of the trench groove 5 and over the oxide film 4. For this reason, an upper surface of the NSG film 6 as deposited has a generally V-shaped hollow portion which is positioned over the trench groove 5. As shown in FIG. 3F, the generally V-shaped hollow portion of the NSG film 6 is completely filled with the BPSG film 7. The BPSG film 7 shows a surface re-flow upon receipt of a heat, for which reason the surface re-flow of the BPSG film 7 is caused by the post heat treatment. The reduction in size of the generally V-shaped hollow is also caused to have a small taper angle of not more than 20 degrees, and an imperfect planarization to the surface of the BPSG film 7 can be obtained. Namely, a slight or small hollow remains on the surface of the BPSG film 7. After the etch back process, the desirable generally planarized surface can be obtained, wherein the generally planarized surface comprises the surface of the NSG film 6 having the generally V-shaped hollow and the BPSG film 7 remaining in the generally V-shaped hollow.

If the etch-back is made to the oxide film 4, then almost the same generally planarized surface can be obtained because the BPSG film 7 has the generally planarized surface after the heat treatment and before the etch-back. If no step is present on the top surface, the etch-back to thee oxide layer causes almost uniform etching rate over the entirety of the etched-surface.

The generally planarized surface after etch-back process provides the following advantages. In a later process, a metal interconnection layer is once entirely formed over the generally planarized surface, and then the metal interconnection layer is patterned or selectively removed to form an interconnection extending over the generally planarized surface. It is possible to avoid that the metal interconnection layer resides over the generally planarized surface. No metal over the generally planarized surface causes no short circuit between interconnections.

Further, the NSG film 6 fills the trench groove 5. Since the NSG film 6 has a large surface migration and a high surface coverage, in the chemical vapor deposition process, the NSG film 6 is deposited with keeping a thickness uniformity on side walls and a bottom of the trench groove 5 and over the oxide film 4. Namely, in the chemical vapor deposition process, the thickness of the NSG film 6 adjacent to an opening edge of the trench groove 5 is substantially equal to the other portions thereof. This may cause no void in the NSG film 6 in the trench groove 5. No void causes no deterioration of the trench isolation.

Consequently, the NSG film 6 having the large surface migration and the high surface coverage is suitable for avoiding the void formation even allowing the generally V-shaped hollow on its surface. However, the BPSG film 7 showing the surface re-flow upon heat treatment is deposited over the NSG film 6 for obtaining the generally planarized surface, whereby the etch-backed surface is the generally planarized surface which is suitable for forming integrated circuits.

Second Embodiment:

A second embodiment according to the present invention will be described in detail with reference to the drawings. FIGS. 4A through 4H are fragmentary cross sectional elevation views illustrative of trench isolations in silicon-on-insulator substrates in sequential steps involved in a second novel method in a second embodiment in accordance with the present invention.

Figure 4A:
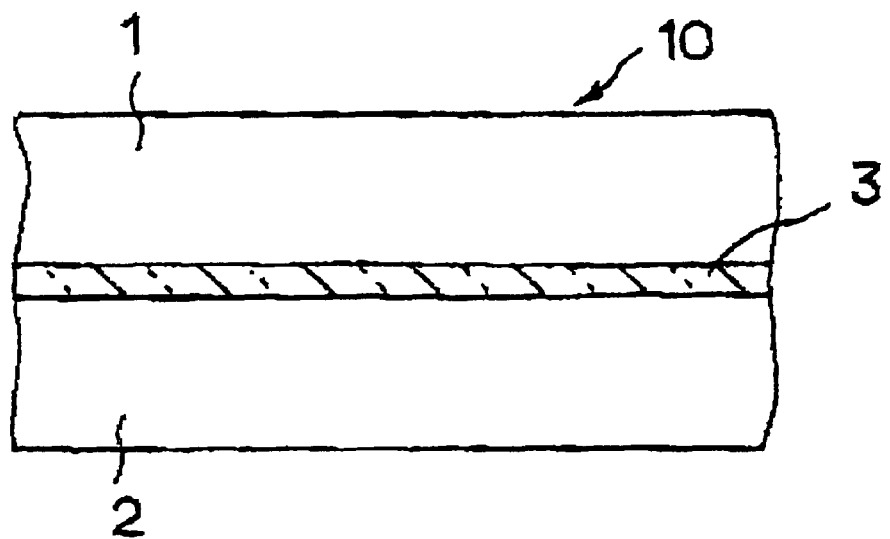
FIGS. 4A through 4H are fragmentary cross sectional elevation views illustrative of trench isolations in silicon-on-insulator substrates in sequential steps involved in a second novel method in a second embodiment in accordance with the present invention.

With reference to FIG. 4A, a silicon-on-insulator substrate 10 is prepared, wherein the silicon-on-insulator substrate 10 comprises first and second silicon substrates 1 and 2 and a buried insulating layer 3 sandwiched between the first and second silicon substrates 1 and 2. The silicon-on-insulator substrate 10 may be formed as follows.

A surface of the first silicon substrate 1 is subjected to a thermal oxidation to form a buried insulating layer 3 on the surface of the first silicon substrate 1. The second silicon substrate 2 is combined with the buried insulating layer 3 on the first silicon substrate 1. A surface of the first silicon substrate 1 is then polished to form a planarized main face of the silicon-on-insulator substrate 10.

A thickness, a conductivity type and a resistivity of the first silicon substrate 1 may be decided depending on semiconductor devices with high withstand voltages, for examples, MOS transistors and bipolar transistors. For example, the thickness may be 5 micrometers, the conductivity type may be p-type, and the resistivity may be ranged from 10–20 ohms cm.

Since the first silicon substrate 1 is relatively thin, the second silicon substrate 2 serves as a supporting substrate. The thickness of the second silicon substrate 2 is preferably thicker than the first silicon substrate 1. The thickness of the second silicon substrate 2 may be ranged from 600–700 micrometers. A conductivity type and a resistivity of the second silicon substrate 2 may be decided independent from semiconductor devices with high withstand voltages, for examples, MOS transistors and bipolar transistors. For example, the conductivity type may be p-type, and the resistivity may be ranged from 1–50 ohms cm.

The buried insulating layer 3 is provided not only for allowing isolation but also for allowing high withstand voltage. The increase in thickness of the buried insulating layer 3 increases the withstand voltage for high voltage semiconductor devices. The buried insulating layer 3 may generally comprise an $SiO_2$ layer formed by a thermal oxidation. For forming an MOSFET with a withstand voltage of 100V, a preferable thickness of the buried insulating layer 3 may be about 1 micrometer. For forming an MOSFET with a withstand voltage of 200V, a preferable thickness of the buried insulating layer 3 may be about 2 micrometers.

Figure 4B:
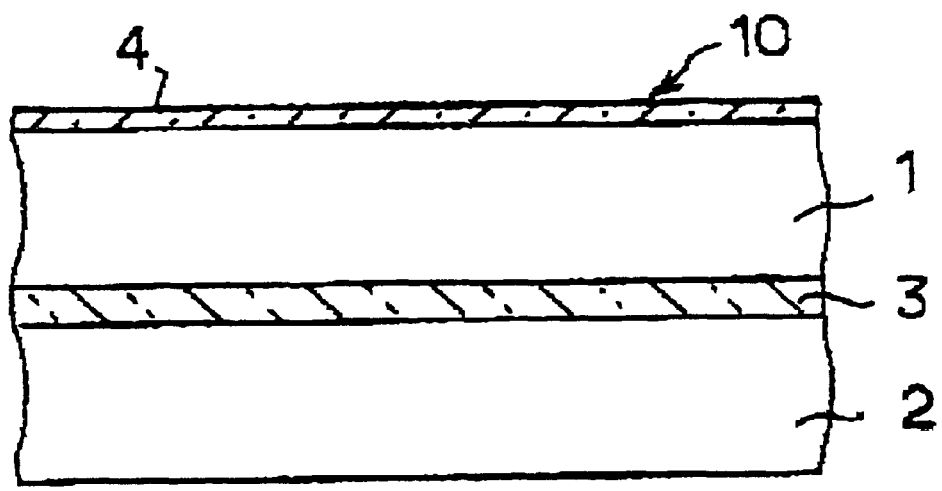

With reference to FIG. 4B, an oxide film 4 is formed on the planarized surface of the first silicon substrate 1 by either a thermal oxidation or a chemical vapor deposition. A thickness of the oxide film 4 may be about 5 micrometers.

Figure 4C:
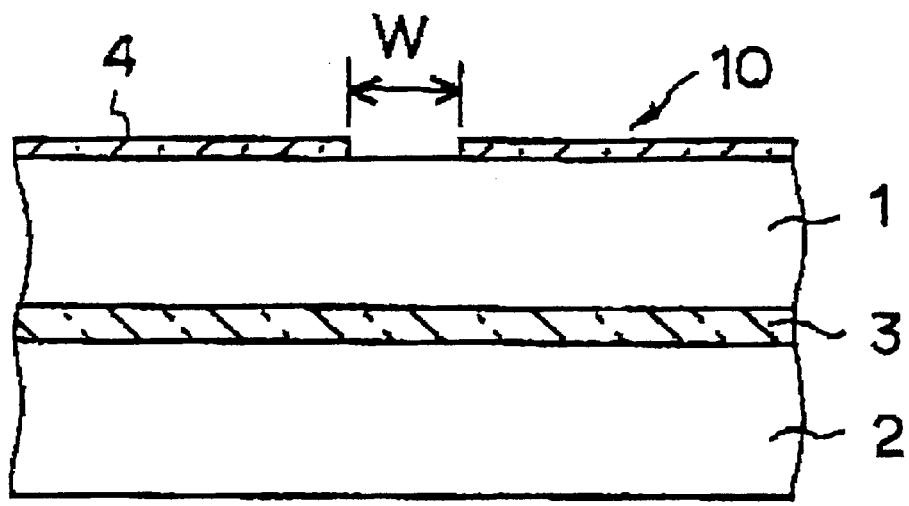

With reference to FIG. 4C, a photo-resist film is applied on the oxide film 4. The photo-resist film is patterned by a photo-lithography technique to form a photo-resist mask on the oxide film 4. The photo-resist mask is used as an etching mask for carrying out an anisotropic etching for selectively etching the oxide film 4 at a predetermined pattern width "W", so that a part of the surface of the first silicon substrate 1 is exposed.

Figure 4D:
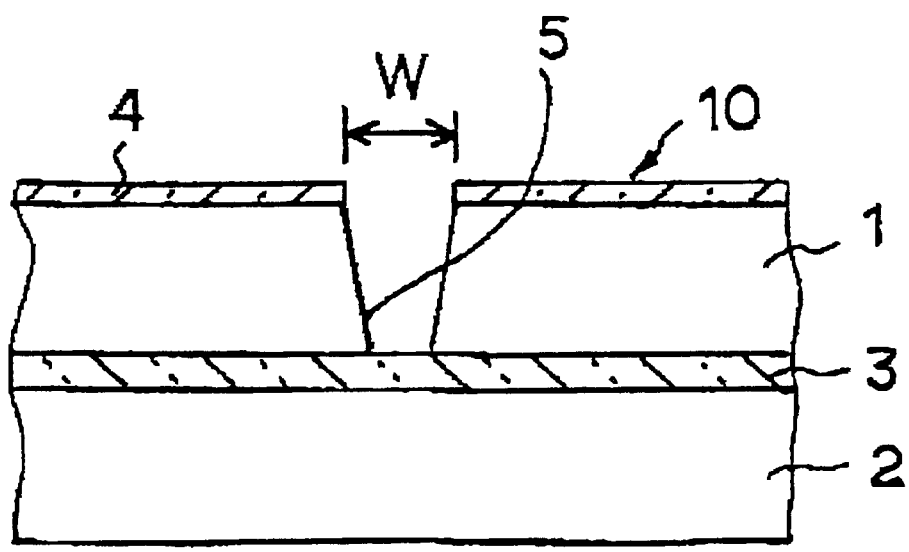

With reference to FIG. 4D, a reactive ion etching process is then carried out using the oxide film 4 as a mask for selectively etching the first silicon substrate 1 to form a trench groove 5 in the first silicon substrate 1, wherein the trench groove 5 reaches the buried insulating layer 3. An incline gradient of the trench groove 5 may vary depending on combinations of used etching gases and flow rates. A generally available incline gradient of the trench groove 5 may be ranged from about 80 degrees to about 90 degrees. The trench groove 5 has an opening width "W" defined by the opening width "W" of the oxide film 4. A bottom width of the trench groove 5 depends on the incline gradient. For forming an MOSFET with a withstand voltage of 100V, a preferable opening width "W" of the oxide film 4 may be ranged from about 1 micrometer to about 2 micrometers.

Figure 4E:
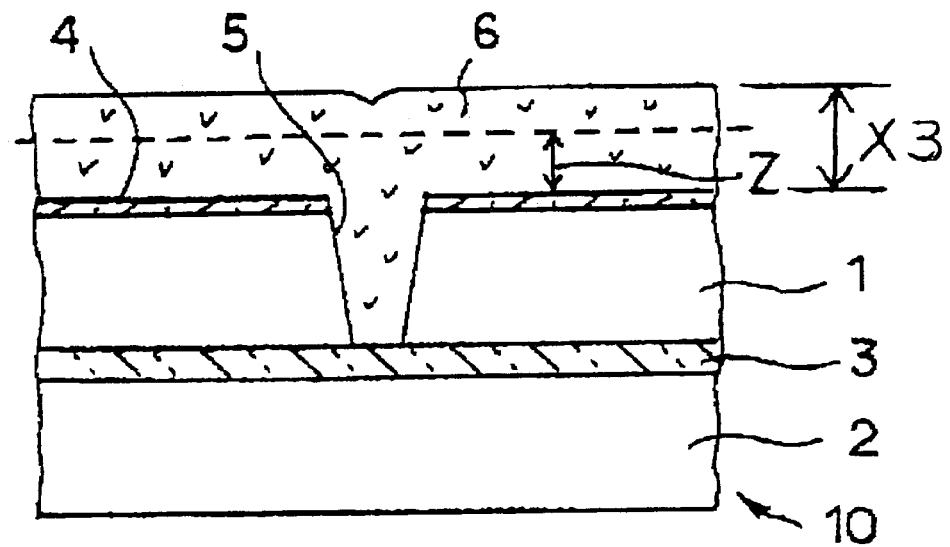

With reference to FIG. 4E, a low pressure chemical vapor deposition process is carried out using a TEOS (Tetra Etyl Ortho Silicate) gas to deposit a TEOS-NSG (Non-doped Silicate Glass) film 6 both within the trench groove 5 and over the oxide film 4, whereby the trench groove 5 is completely filled with the TEOS-NSG film 6. NSG (Non-doped Silicate Glass) is an undoped oxide material which is similar to TEOS-$SiO_2$. The low pressure chemical vapor deposition process is suitable for a low deposition rate of not more than 30 nm/min for completely filling the TEOS-NSG film 6 within the trench groove 5 having a width of 1–2 micrometers and a depth of 5 micrometers.

This TEOS-NSG film 6 has a large surface migration and a good surface coverage. In the low pressure chemical vapor deposition process, the TEOS-NSG film 6 is deposited with substantially keeping a thickness uniformity on side walls and a bottom of the trench groove 5 and over the oxide film 4. Namely, in the low pressure chemical vapor deposition process, the thickness of the TEOS-NSG film 6 is increased with keeping the thickness uniformity on side walls and a bottom of the trench groove 5 and over the oxide film 4. For this reason, an upper surface of the TEOS-NSG film 6 as deposited has a generally V-shaped hollow portion which is positioned over the trench groove 5. A heat treatment is then carried out at 900° C. for 10 minutes in a nitrogen atmosphere for stabilizing the film quality of the TEOS-NSG film 6. A thickness "X3" of the TEOS-NSG film 6 over the oxide film 4 is sufficiently larger than a predetermined thickness value "Z".

Figure 4F:
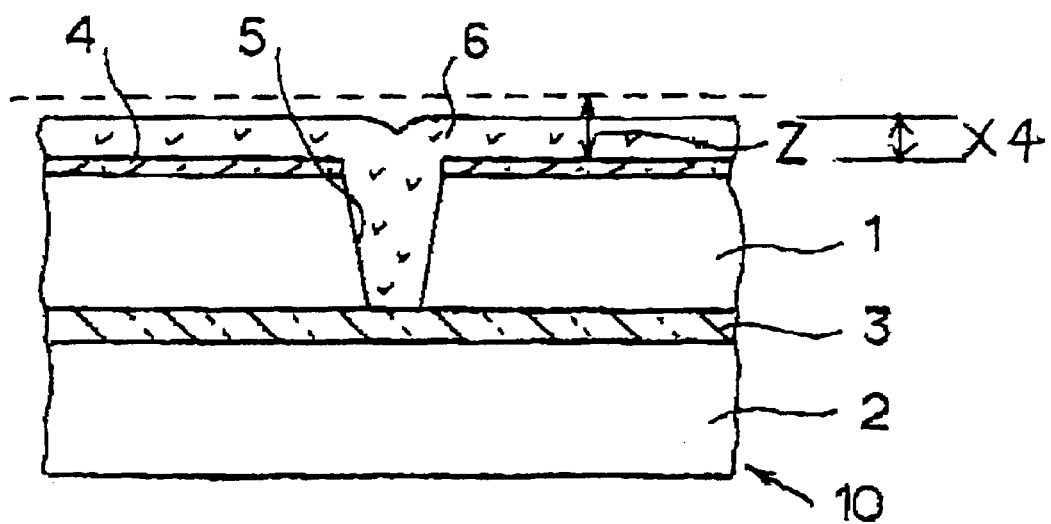

With reference to FIG. 4F, the TEOS-NSG film 6 is subjected to an etch-back to reduce the above thickness "X3" to a thickness "X4" which is smaller than the predetermined thickness value "Z". This etch-back process reduces the size of the generally V-shaped hollow portion.

Figure 4G:
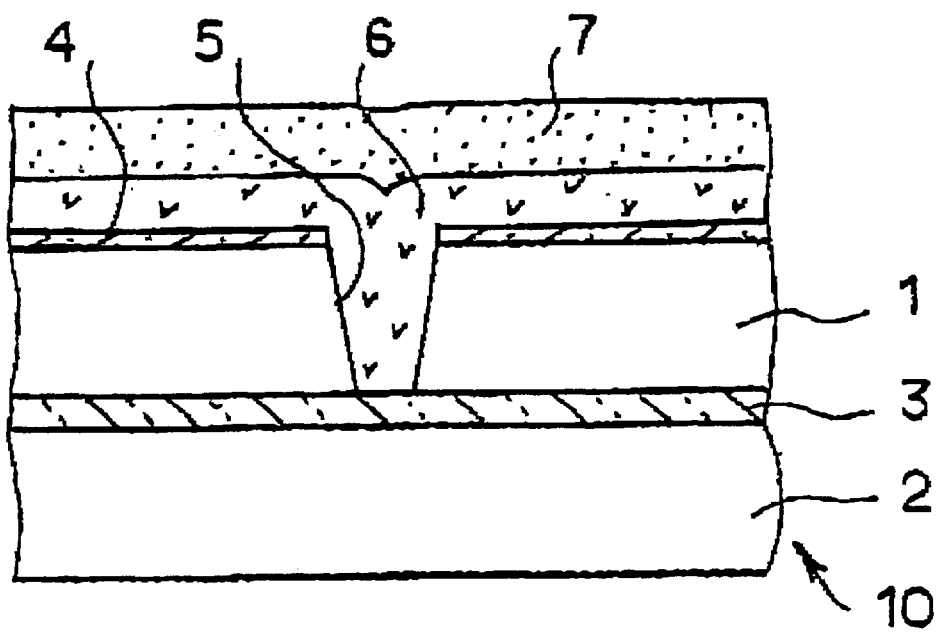

With reference to FIG. 4G, another low pressure chemical vapor deposition process is carried out using a TEOS (Tetra Etyl Ortho Silicate) gas to deposit a TEOS-BPSG (boro-phospho-silicate glass) film 7 over the TEOS-NSG film 6 for completely filling the size-reduced generally V-shaped hollow portion of the TEOS-NSG film 6 with the TEOS-BPSG film 7. Another small size generally V-shaped hollow portion is formed on the surface of the TEOS-BPSG film 7. Since the size of the generally V-shaped hollow portion of the TEOS-NSG film 6 is reduced, the generally V-shaped hollow portion of the TEOS-BPSG film 7 has a small size. A total thickness of the TEOS-BPSG film 7 and the TEOS-NSG film 6 over the oxide film 4 is larger than the predetermined thickness value "Z".

Optionally, no heat treatment for further size reduction of the generally V-shaped hollow portion of the TEOS-BPSG film 7 may be carried out. Alternatively, it is, of course, preferable that a heat treatment may be carried out at about 800–900° C. for about 10 minutes in a nitrogen atmosphere to cause a surface re-flow of the BPSG film 7, whereby the small size generally V-shaped hollow portion on the surface of the BPSG film 7 is further reduced in size. Namely, a slight and smooth hollow resides on the surface of the BPSG film 7.

Alternatively to the above chemical vapor deposition process, a normal pressure chemical vapor deposition process with a higher deposition rate than the low pressure chemical vapor deposition process may be available by use of the TEOS gas, provided that the generally V-shaped hollow portion of the TEOS-NSG film 6 is completely filled with the TEOS-BPSG film 7. For using the TEOS gas, trimethylphosphate (P(OCH$_3$)$_3$), triethylborate (B(OC$_2$H$_5$)$_3$), and either oxygen (O$_2$) or ozone (O$_3$) are used as additives. Another generally V-shaped hollow portion is formed on the surface of the TEOS-BPSG film 7.

Further alternatively, a normal pressure chemical vapor deposition process with a higher deposition rate than the low pressure chemical vapor deposition process may also be available without using the TEOS gas to deposit a BPSG film 7, provided that the generally V-shaped hollow portion of the TEOS-NSG film 6 is completely filled with the BPSG film 7. Instead of the TEOS gas, silane (SiH$_4$), phosphine (PH$_3$), diborane (B$_2$H$_6$), and oxygen (O$_2$) are used. Another generally V-shaped hollow portion is formed on the surface of the BPSG film 7.

Figure 4H:
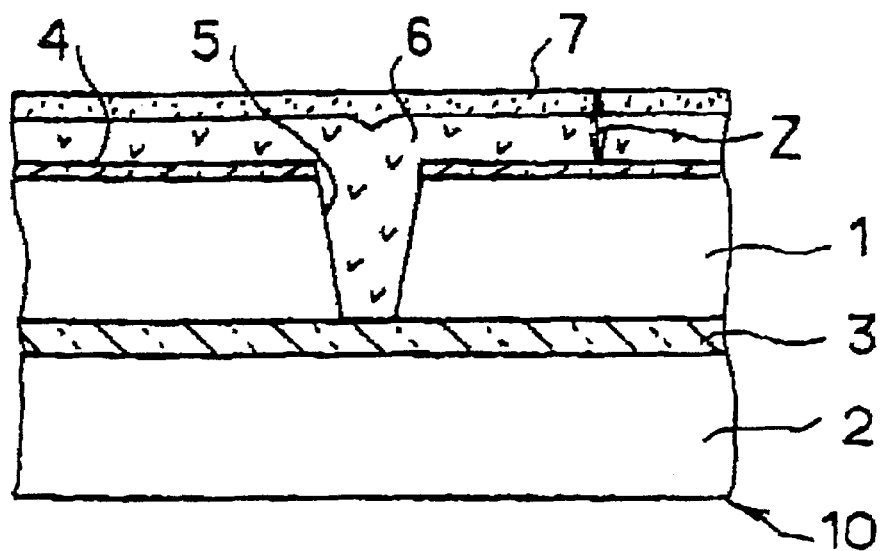

With reference to FIG. 4H, the BPSG film 7 is then subjected to an etch-back so that the total thickness of the TEOS-NSG film 6 and the BPSG film 7 over the oxide film 4 becomes the predetermined thickness value "Z", wherein the BPSG film 7 remains not only within the small size generally V-shaped hollow portion of the TEOS-NSG film 6 but also over the surface of the TEOS-NSG film 6.

As described above, the trench groove 5 is completely filled with the NSG film 6. This NSG film 6 has a large surface migration and a good surface coverage, for which reason no void is formed in the NSG film 6. In the chemical vapor deposition process, however, the NSG film 6 is deposited with substantially keeping a thickness uniformity on side walls and a bottom of the trench groove 5 and over the oxide film 4. Namely, in the chemical vapor deposition process, the thickness of the NSG film 6 is increased with keeping the thickness uniformity on side walls and a bottom of the trench groove 5 and over the oxide film 4. For this reason, an upper surface of the NSG film 6 as deposited has a generally V-shaped hollow portion which is positioned over the trench groove 5. However, the NSG film 6 is then etched back, thereby reducing the size of the generally V-shaped hollow portion, before the small size generally V-shaped hollow portion of the NSG film 6 is then completely filled with the BPSG film 7. The BPSG film 7 shows a surface re-flow upon receipt of a heat, for which reason the surface re-flow of the BPSG film 7 is caused by the post heat treatment. The further reduction in size of the generally V-shaped hollow is also caused to have a small taper angle of less than 20 degrees, and an imperfect planarization to the surface of the BPSG film 7 can be obtained. Namely, a slight or small hollow remains on the surface of the BPSG film 7. After the etch back process, the desirable generally planarized surface of the BPSG film 7 can be obtained.

In this second embodiment, the two separate etch-back processes are made for the NSG film 6 and the BPSG film 7, respectively for the purpose of the planarizations of the respective surfaces of the NSG film 6 and the BPSG film 7. The etch-back to the same material or the same film is suitable for obtaining the uniform etching rate and desirable more plane surface.

If the etch-back is made to the oxide film 4, then almost the same generally planarized surface can be obtained because the BPSG film 7 has the generally planarized surface after the heat treatment and before the etch-back. If no step is present on the top surface, the etch-back to thee oxide layer causes almost uniform etching rate over the entirety of the etched-surface.

The generally planarized surface after etch-back process provides the following advantages. In a later process, a metal interconnection layer is once entirely formed over the generally planarized surface, and then the metal interconnection layer is patterned or selectively removed to form an interconnection extending over the generally planarized surface. It is possible to avoid that the metal interconnection layer resides over the generally planarized surface. No metal over the generally planarized surface causes no short circuit between interconnections.

Further, the NSG film 6 fills the trench groove 5. Since the NSG film 6 has a large surface migration and a high surface coverage, in the chemical vapor deposition process, the NSG film 6 is deposited with keeping a thickness uniformity on side walls and a bottom of the trench groove 5 and over the oxide film 4. Namely, in the chemical vapor deposition process, the thickness of the NSG film 6 adjacent to an opening edge of the trench groove 5 is substantially equal to the other portions thereof. This may cause no void in the NSG film 6 in the trench groove 5. No void causes no deterioration of the trench isolation.

Consequently, the NSG film 6 having the large surface migration and the high surface coverage is suitable for avoiding the void formation even allowing the generally V-shaped hollow on its surface. However, the BPSG film 7 showing the surface re-flow upon heat treatment is deposited over the NSG film 6 for obtaining the generally planarized surface, whereby the etch-backed surface is the generally planarized surface which is suitable for forming integrated circuits.

Needless to say, the above first and second novel methods of the first and second embodiments are applicable to the formation of the trench isolation in substrates of any types, for example, elemental semiconductor substrates such as a silicon substrate, compound semiconductor substrates, semi-insulating substrates, insulating substrates and silicon-on-insulator substrates.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A method of forming a trench isolation in a substrate, said method comprising the steps of:

forming a trench groove in a substrate;

forming a first electrically insulating layer which fills said trench groove and extends over an upper surface of said substrate, wherein said first electrically insulating layer has a first surface migration, and an upper surface of said first electrically insulating layer has a first hollow positioned over said trench groove; and forming a second electrically insulating layer over said first electrically insulating layer, wherein said second electrically insulating layer fills said first hollow, and an upper surface of said second electrically insulating layer has a second hollow positioned over said trench groove, and said second electrically insulating layer has a second surface migration smaller than said firm surface migration.

2. The method as claimed in claim 1, further comprising the step of: carrying out a heat treatment to cause a surface re-flow of said second electrically insulating layer, whereby said second hollow is reduced in size.

3. The method as claimed in claim 2, further comprising the step of: carrying out an etch hack to said first and second electrically insulating layers after said heal treatment, whereby said second hollow is reduced in size.

4. The method as claimed in claim 3, wherein a taper angle of said second hollow after said etch back is not more than 20 degrees.

5. The method as claimed in claim 1, wherein a thickness of said first electrically insulating layer over said upper surface of said substrate is almost equal to a distance between said first hollow and an opening edge of said trench groove.

6. The method as claimed in claim 1, wherein a thickness of said first electrically insulating layer over said upper surface of said substrate is larger than a half of an opening diameter of said trench groove.

7. The method as claimed in claim 1, further comprising the step of: carrying out an etch-back to said first electrically insulating layer only, whereby said first hollow is reduced in size, before said second electrically insulating layer is then formed over said etch-backed surface of said first electrically insulating layer.

8. The method as claimed in claim 7, further comprising the step of: carrying out another etch-back to said second electrically insulating layer only separately from said etch-back to said first electrically insulating layer, whereby said second hollow is reduced in size.

9. The method as claimed in claim 8, further comprising the step of: carrying out a heat treatment to cause a surface re-flow of said second electrically insulating layer, whereby said second hollow is reduced in size, before said another etch-back to said second electrically insulating layer.

10. The method as claimed in claim 1, wherein said first electrically insulating layer comprises a non-doped silicate glass film.

11. The method as claimed in claim 10, wherein said non-doped silicate glass film is formed by a low pressure chemical vapor deposition using a tetra ethyl ortho silicate gas.

12. The method as claimed in claim 1, wherein said second electrically insulating layer comprises a boro-phospho silicate glass film.

13. The method as claimed in claim 12, wherein said boro-phospho silicate glass film is formed by a low pressure chemical vapor deposition using a tetra ethyl ortho silicate gas.

14. The method as claimed in claim 12, wherein said boro-phospho silicate glass film is formed by a normal pressure chemical vapor deposition using a tetra ethyl ortho silicate gas.

15. The method as claimed in claim 12, wherein said boro-phospho silicate glass film is formed by a normal pressure chemical vapor deposition using silane ($SiH_4$), phosphine ($PH_3$), dihorane ($B_2H_6$), and oxygen ($O_2$).

16. The method as claimed in claim 1, wherein said first electrically insulating layer has a first re-flowablity, and said second electrically insulating layer has a second re-flowablity larger than said first re-flowablity.

17. The method as claimed in claim 1, wherein said first electrically insulating layer has a first surface coverage, and said second electrically insulating layer has a second surface coverage smaller than said first surface coverage.

18. A method of planarizing an insulator over a trench, comprising the steps of:

forming a trench in substrate;

depositing on the substrate a first insulating layer of one of a non-doped silicate glass (NSG) and silicon oxide using a tetra ethyl ortho silicate (TEOS) gas the first insulating layer completely filling the trench and having an upper surface with first hollow over the trench;

depositing on the upper surface of the first insulating layer a second insulating layer of borophosphosilicate glass (BPSG) using a TEOS gas, the first insulating layer having an upper surface with a second hollow over the first hollow; and etching the second insulating layer to planarize the insulator over the trench.

* * * * *